(12) United States Patent
Chung et al.

(10) Patent No.: US 8,816,330 B2
(45) Date of Patent: *Aug. 26, 2014

(54) ORGANIC SEMICONDUCTOR COMPOSITION, AND TRANSISTOR AND ELECTRONIC DEVICE INCLUDING A POLYMER THEREFROM

(75) Inventors: Jong Won Chung, Gimpo-si (KR); Do-Hwan Kim, Anyang-si (KR); Bang Lin Lee, Suwon-Si (KR); Jeong il Park, Seongnam-si (KR); Yong Wan Jin, Seoul (KR); Sang Yoon Lee, Seocho-gu (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 294 days.

This patent is subject to a terminal disclaimer.

(21) Appl. No.: 13/166,425

(22) Filed: Jun. 22, 2011

(65) Prior Publication Data
US 2012/0126207 A1    May 24, 2012

(30) Foreign Application Priority Data
Nov. 22, 2010 (KR) .......................... 10-2010-0116163

(51) Int. Cl.
*H01L 29/08* (2006.01)
*H01L 35/24* (2006.01)
*H01L 51/00* (2006.01)
*H01B 1/02* (2006.01)
*H01B 1/12* (2006.01)

(52) U.S. Cl.
USPC ..................... 257/40; 252/519.3; 252/519.34; 257/E51.003; 257/E51.006; 257/E51.027; 526/256

(58) Field of Classification Search
USPC ............ 252/519.3, 519.34; 257/40, E51.006, 257/E51.003, E51.027; 526/256; 528/9
See application file for complete search history.

(56) References Cited

U.S. PATENT DOCUMENTS

| 5,556,524 | A | * | 9/1996 | Albers ..................... 204/403.06 |
| 5,946,551 | A | | 8/1999 | Dimitrakopoulos et al. |
| 6,166,172 | A | | 12/2000 | McCullough et al. |
| 6,232,157 | B1 | | 5/2001 | Dodabalapur et al. |
| 7,368,510 | B2 | | 5/2008 | Lee et al. |
| 7,374,702 | B2 | | 5/2008 | Marks et al. |
| 2,006,291 | A1 | | 3/2009 | Miura et al. |

(Continued)

FOREIGN PATENT DOCUMENTS

| EP | 0 414 906 A1 | 3/1991 |
| EP | 2 006 291 A1 | 12/2008 |

(Continued)

OTHER PUBLICATIONS

European Search Report dated Nov. 11, 2010 in corresponding European Application No. 10167763.1.

(Continued)

*Primary Examiner* — Bijan Ahvazi
(74) *Attorney, Agent, or Firm* — Harness, Dickey & Pierce, P.L.C.

(57) ABSTRACT

An organic composition for a semiconductor device includes a compound for an organic semiconductor device including a structural unit; and a metal-containing compound selected from a transition element-containing compound, a lanthanide-containing compound, and a combination thereof, which results in improved charge mobility due to a reduced grain boundary.

9 Claims, 4 Drawing Sheets

(56) References Cited

U.S. PATENT DOCUMENTS

| | | | |
|---|---|---|---|
| 2004/0054095 A1 | 3/2004 | Allen et al. | |
| 2006/0124909 A1 | 6/2006 | Marks et al. | |
| 2008/0182371 A1* | 7/2008 | Gehring et al. | 438/199 |
| 2008/0293937 A1 | 11/2008 | Marks et al. | |
| 2009/0023842 A1 | 1/2009 | Laird et al. | |
| 2011/0001131 A1* | 1/2011 | Lee et al. | 257/40 |

FOREIGN PATENT DOCUMENTS

| | | |
|---|---|---|
| JP | 2008097949 A | 4/2008 |
| JP | 2008-195911 | 8/2008 |
| KR | 1020060056824 | 5/2006 |
| KR | 10-2007-195911 | 11/2007 |
| KR | 1020090113990 | 11/2009 |
| KR | 1020090118598 | 11/2009 |
| KR | 1020100031566 | 3/2010 |
| WO | WO 02-09201 A | 1/2002 |
| WO | WO-2008144750 A1 | 11/2008 |

OTHER PUBLICATIONS

Pham et al. (J. Org. Chem, 1984, vol. 49, pp. 5250-5253).
Yamamoto et al. (Macromolecules 1992, vol. 25, pp. 1214-1223).
Stille et al. (Angew. Chem. Int. Ed. Engl. 1986, vol. 25, pp. 508-524).
Suzuki et al. (J. Am. Chem. Soc. 1989, vol. 111, pp. 314-321).
Yoon et al. (J. Am. Chem. Soc. 2006, vol. 128, pp. 5792-5801).

* cited by examiner

FIG. 5

ORGANIC SEMICONDUCTOR COMPOSITION, AND TRANSISTOR AND ELECTRONIC DEVICE INCLUDING A POLYMER THEREFROM

CROSS-REFERENCE TO RELATED APPLICATIONS

This application claims the benefit of Korean Patent Application No. 10-2010-0116163, filed on Nov. 22, 2010, in the Korean Intellectual Property Office (KIPO), the entire contents of which are incorporated herein by reference.

BACKGROUND

1. Field

Example embodiments relate to a composition for an organic semiconductor device, and a transistor and an electronic device including a polymer therefrom.

2. Description of the Related Art

Progressing to the information-oriented society requires developing a new image display device which does not have the drawbacks of the conventional cathode ray tube (CRT) with a heavy weight and larger volume. Accordingly, several flat panel displays, e.g., a liquid crystal display (LCD), an organic light emitting diode (OLED) display, a plasma display panel (PDP) and a surface-conduction electron-emitter display (SED), are drawing attention.

A thin film transistor (TFT) including a semiconductor layer of amorphous silicon is widely used for a switching device of the flat panel displays. The amorphous silicon thin film transistor is widely used due to its improved uniformity and electrical characteristics in a doping state, and improved insulating characteristics in a non-doping state.

However, in order to deposit the conventional amorphous silicon thin film transistor on a substrate, there are limits in carrying out the process at a higher temperature of 300° C. Therefore, applying the amorphous silicon TFT to a polymer substrate for accomplishing a flexible display may be difficult.

In order to solve the problems, an organic thin film transistor (OTFT) using an organic semiconductor material has been suggested. The organic thin film transistor generally includes a substrate, a gate electrode, an insulation layer, a source electrode, a drain electrode and a channel region. The OTFT may be classified as a bottom contact (BC) type in which a channel region is formed on the source electrode and the drain electrode, and a top contact (TC) type in which a metal electrode is formed on the channel region due to mask deposition.

A low molecular or oligomer organic semiconductor material filled in the channel region of the organic thin film transistor (OTFT) may include merocyanine, phthalocyanine, perylene, pentacene, C60 and a thiophene oligomer. The low molecular or oligomer organic semiconductor material may be a thin film formed on the channel region according to a vacuum process. Organic semiconductor polymer materials have workability in that larger-area processing is possible using a solution method, e.g., printing techniques, at a lower cost.

SUMMARY

As an organic semiconductor material, the organic semiconductor polymer has a grain boundary inhibiting charge mobility. Accordingly, example embodiments provide an organic composition for a semiconductor device having improved charge mobility due to a reduced grain boundary. Example embodiments also provide a transistor including a polymer obtained from the organic composition for a semiconductor. Example embodiments also provide an electronic device including the polymer obtained from the organic composition for a semiconductor device.

According to example embodiments, an organic composition for a semiconductor device may include a compound for an organic semiconductor device including a structural unit represented by the following Chemical Formula 1; and a metal-containing compound selected from a transition element-containing compound, a lanthanide-containing compound, and a combination thereof.

[Chemical Formula 1]

In Chemical Formula 1,

Ar is a substituted or unsubstituted $C_6$ to $C_{30}$ aromatic ring group, a substituted or unsubstituted $C_4$ to $C_{30}$ heteroaromatic ring group, or a substituted or unsubstituted $C_6$ to $C_{30}$ condensed polycyclic group, n is an integer ranging from 1 to 100, $Y_1$ and $Y_2$ are each independently a single bond, a substituted or unsubstituted $C_6$ to $C_{30}$ arylene group having a conjugation structure, or a substituted or unsubstituted $C_6$ to $C_{30}$ alkenylene group having a conjugation structure, and $X_1$ and $X_2$ are each independently hydrogen, a halogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, $NR^3R^4$ (wherein $R^3$ and $R^4$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, or a combination thereof), a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group, provided that at least one of $X_1$ and $X_2$ is a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group.

The Ar may be selected from a thiophene group, a thiazole group, a thiadiazole group, an oxazole group, an isoxazole group, an oxadiazole group, an imidazole group, a pyrazole group, a triazole group, a tetrazole group, a pyridine group, a pyridazine group, a quinoline group, an isoquinoline group, a quinoxaline group, a naphthyridine group, a benzoimidazole group, a pyrimidine group, a pyrimidopyrimidine group, a benzothiadiazole group, a benzoselenadiazole group, a benzotriazole group, a benzothiazole group, a benzoxazole group, a phenanthroline group, a phenazine group, a pyrazine group, a triazine group, a pyridopyrimidine group, a phenaphthyridine group, a naphthalene group, an anthracene group, a tetracene group, an n-phenylene group, or a combination thereof.

The $Y_1$ and $Y_2$ are each independently an alkyl-substituted benzene group, a substituted or unsubstituted thiophene group, a substituted or unsubstituted vinylene group, or a combination thereof.

The $X_1$ and $X_2$ are each independently a substituted or unsubstituted benzoic acid group, a substituted or unsubstituted thiophene carboxylic acid group, a substituted or unsubstituted pyridine group, a substituted or unsubstituted pyrimidine group, or a substituted or unsubstituted triazine group.

When n is 2 to 100, at least two of the Ar groups may be linked through a linker selected from —$CR^1R^2$—, —O—, —S—, —$SO_2$—, —CO—, —COO—, —COO—, —$CR^3$=$CR^4$—, —C≡C—, and —$SiR^5R^6$— (wherein $R^1$ to $R^6$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof).

The compound for an organic semiconductor device may have a molecular weight (in case of a polymer, a number average molecular weight (Mn)) of about 1,000 to about 100,000, and specifically about 10,000 to 100,000.

The metal-containing compound may be a compound including a metal selected from zinc (Zn), silver (Ag), copper (Cu), nickel (Ni), cobalt (Co), and platinum (Pt).

Examples of the compound for an organic semiconductor device represented by the above Chemical Formula 1 may be compounds represented by the following Chemical Formulae 2-1 to 2-4.

[Chemical Formula 2-1]

[Chemical Formula 2-2]

[Chemical Formula 2-3]

[Chemical Formula 2-4]

In Chemical Formulae 2-1 to 2-4, $R^1$ to $R^4$ are each independently selected from a fluoro group, a $C_1$ to $C_{30}$ linear or branched alkyl group, a $C_3$ to $C_{30}$ cycloalkyl group, a $C_1$ to $C_{20}$ fluoroalkyl group, a $C_1$ to $C_{20}$ perfluoroalkyl group ($C_nF_{2n+1}$), a $C_1$ to $C_{30}$ linear or branched alkoxy group, a $C_3$ to $C_{30}$ cycloalkoxy group, a $C_2$ to $C_{30}$ linear or branched alkoxyalkyl group, a $C_4$ to $C_{30}$ cycloalkoxyalkyl group, and a combination thereof, and m is an integer ranging from 1 to 100.

The metal-containing compound may be a salt of a metal selected from Zn, Ag, Cu, Ni, Co, and Pt, and a combination thereof. The salt may include at least one of a sulfate, a chlorate, a nitrate, and a combination thereof.

According to example embodiments, a transistor may include an ICP (infinite coordination polymer) including the organic composition according to example embodiments, wherein the ICP may include at least two compounds linked to each other through a transition element ion or a lanthanide ion.

The transistor may further include a gate electrode on a substrate, a source electrode and a drain electrode facing each other and defining a channel region, an insulation layer configured to electrically insulate the source electrode and drain electrode, and the gate electrode, and an active layer including the ICP in the channel region.

According to example embodiments, an electronic device may include an ICP (infinite coordination polymer) including the organic composition according to example embodiments, wherein the ICP includes at least two compounds linked to each other through a transition element ion or a lanthanide ion.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

This disclosure will be described more fully hereinafter with reference to the accompanying drawings, in which example embodiments are shown. This disclosure may, however, be embodied in many different forms and is not be construed as limited to example embodiments set forth herein.

In the drawings, the thickness of layers, films and panels are exaggerated for clarity. Like reference numerals designate like elements throughout the specification. It will be understood that when an element such as a layer, film, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term "aromatic ring group" may refer to a $C_5$ to $C_{30}$ cycloalkenyl group or $C_6$ to $C_{30}$ aryl group, and the term "heteroaromatic ring group" may refer to a $C_2$ to $C_{30}$ heteroaryl group, a $C_3$ to $C_{30}$ heterocycloalkenyl group, or a $C_3$ to $C_{30}$ heterocycloalkynyl group. The term "condensed polycyclic group" may refer to a fused ring including at least one cyclic group selected from a $C_3$ to $C_{30}$ cycloalkyl group, a $C_3$ to $C_{30}$ cycloalkenyl group, a $C_2$ to $C_{30}$ heterocycloalkyl group, a $C_2$ to $C_{30}$ heteroaryl group, and a $C_3$ to $C_{30}$ heterocycloalkenyl group, which is linked to the heteroaromatic ring group described above.

As used herein, when a specific definition is not otherwise provided, the term "hetero" may refer to one including heteroatoms selected from the group consisting of N, O, S, Si, and P, and including 1 to 4 heteroatoms in one ring.

As used herein, when a specific definition is not otherwise provided, the term "substituted" refers to a functional group or a compound substituted with at least a functional group selected from a fluoro group, a $C_1$ to $C_{30}$ linear or branched alkyl group, for example, a $C_1$ to $C_{10}$ linear or branched alkyl group, a $C_3$ to $C_{30}$ cycloalkyl group, for example, a $C_3$ to $C_{12}$ cycloalkyl group, a $C_1$ to $C_{20}$ linear or branched fluoroalkyl group, for example, a $C_1$ to $C_{10}$ linear or branched fluoroalkyl group, a $C_1$ to $C_{20}$ perfluoroalkyl group ($C_nF_{2n+1}$), for example, a $C_1$ to $C_{10}$ perfluoroalkyl group, a $C_1$ to $C_{30}$ linear or branched alkoxy group, for example, a $C_1$ to $C_{10}$ linear or branched alkoxy group, a $C_3$ to $C_{30}$ cycloalkoxy group, for example, a $C_3$ to $C_{12}$ cycloalkoxy group, a $C_2$ to $C_{30}$ linear or branched alkoxyalkyl group, for example, a $C_2$ to $C_{10}$ linear or branched alkoxyan alkyl group, a $C_4$ to $C_{30}$ cycloalkoxyalkyl group, for example, a $C_4$ to $C_{12}$ cycloalkoxyalkyl group, and a combination thereof.

According to example embodiments, an organic composition for a semiconductor device may include a compound including a structural unit represented by the following Chemical Formula 1; and a metal-containing compound selected from a transition element-containing compound, a lanthanide-containing compound, and a combination thereof.

[Chemical Formula 1]

In Chemical Formula 1,

Ar is a substituted or unsubstituted $C_6$ to $C_{30}$ aromatic ring group, a substituted or unsubstituted $C_4$ to $C_{30}$ heteroaromatic ring group, or a substituted or unsubstituted $C_6$ to $C_{30}$ condensed polycyclic group, and n is an integer ranging from 1 to 100.

$Y_1$ and $Y_2$ are each independently a single bond, a substituted or unsubstituted $C_6$ to $C_{30}$ arylene group having a conjugation structure, or a substituted or unsubstituted $C_6$ to $C_{30}$ alkenylene group having a conjugation structure.

$X_1$ and $X_2$ are each independently hydrogen, a halogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, $NR^3R^4$ (wherein $R^3$ and $R^4$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, or a combination thereof), a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group, provided that at least one of $X_1$ and $X_2$ is a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group.

The Ar may be selected from a thiophene group, a thiazole group, a thiadiazole group, an oxazole group, an isoxazole group, an oxadiazole group, an imidazole group, a pyrazole group, a triazole group, a tetrazole group, a pyridine group, a pyridazine group, a quinoline group, an isoquinoline group, a quinoxaline group, a naphthyridine group, a benzoimidazole group, a pyrimidine group, a pyrimidopyrimidine group, a benzothiadiazole group, a benzoselenadiazole group, a benzotriazole group, a benzothiazole group, a benzooxazole group, a phenanthroline group, a phenazine group, a pyrazine group, a triazine group, a pyridopyrimidine group, a phenaphthyridine group, a naphthalene group, an anthracene group, a tetracene group, an n-phenylene group, or a combination thereof. One of these functional groups may be substituted another functional group.

The $Y_1$ and $Y_2$ are each independently an alkyl-substituted benzene group, a substituted or unsubstituted thiophene group, a substituted or unsubstituted vinylene group, or a combination thereof.

The $X_1$ and $X_2$ are each independently a substituted or unsubstituted benzoic acid group, for example, a methyl benzoic acid group, a substituted or unsubstituted thiophene carboxylic acid group, a substituted or unsubstituted pyridine group, a substituted or unsubstituted pyrimidine group, or a substituted or unsubstituted triazine group. The $X_1$ and $X_2$ may form ionic bonds or coordination bonds with the transition element ions or lanthanide ions in a solvent.

When n is 2 or more, at least two Ar's may be linked through a linker selected from —$CR^1R^2$—, —O—, —S—, —$SO_2$—, —CO—, —COO—, —COO—, —$CR^3$=$CR^4$—, C—, and —$SiR^5R^6$— (wherein $R^1$ to $R^6$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof).

The metal-containing compound may include a compound including a metal selected from Zn, Ag, Cu, Ni, Co, and Pt. The compound for an organic semiconductor device may have a molecular weight (in case of a polymer, a number average molecular weight (Mn)) of about 1,000 to about 100,000, and specifically about 10,000 to 100,000. When the compound has a molecular weight of the above range, at least two compounds for an organic semiconductor device are linked to each other to form an ICP (infinite coordination polymer) well.

The metal of the metal-containing compound may be present in an amount of about 1 mole relative to 1 mole of $X_1$ or $X_2$ of the compound.

The metal of the metal-containing compound binds with $X_1$ or $X_2$ (a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group) to link at least two compounds for an organic semiconductor device and thereby to form an ICP. The compound for an organic semiconductor device dissolves in an organic solvent, and thus, is applicable to a solution process. However, the ICP formed through linkage thereof does not dissolve in an organic solvent and is adequate for manufacture of a multi-layered thin film through a solution process. The ICP formed through linkage of at least two compounds for an organic semiconductor device has a larger grain having a highly ordered structure resulting in reducing trap sites to inhibit charge mobility. Thereby, charge mobility between the compound for an organic semiconductor device may be improved and a threshold voltage of a device may be lowered.

Examples of the compound for an organic semiconductor device represented by Chemical Formula 1 may include compounds represented by the following Chemical Formulae 2-1 to 2-4.

[Chemical Formula 2-1]

[Chemical Formula 2-2]

[Chemical Formula 2-3]

[Chemical Formula 2-4]

In Chemical Formulae 2-1 to 2-4, $R^1$ to $R^4$ are each independently selected from a fluoro group, a $C_1$ to $C_{30}$ linear or branched alkyl group, a $C_3$ to $C_{30}$ cycloalkyl group, a $C_1$ to $C_{20}$ fluoroalkyl group, a $C_1$ to $C_{20}$ perfluoroalkyl group ($C_nF_{2n+1}$), a $C_1$ to $C_{30}$ linear or branched alkoxy group, a $C_3$ to $C_{30}$ cycloalkoxy group, a $C_2$ to $C_{30}$ linear or branched alkoxyalkyl group, a $C_4$ to $C_{30}$ cycloalkoxyalkyl group, and a combination thereof, and m is an integer ranging from 1 to 100.

In Chemical Formulae 2-1 to 2-4, $R^1$ to $R^4$ substituted in each thiophene may be present in plural, and they may be the same or different from each other.

Examples of the transition element-containing compound may include a lanthanide-containing compound including a salt of a metal selected from Zn, Ag, Cu, Ni, Co, and Pt, and specifically a sulfate, a chlorate and a nitrate.

The organic composition for a semiconductor device may be applicable to an active layer of a transistor. The transistor may include a gate electrode positioned on a substrate, a source electrode and a drain electrode facing each other and defining a channel region, an insulation layer that electrically insulates the source electrode and drain electrode, and the gate electrode, and an active layer including the organic semiconductor polymer in the channel region. The active layer may include the composition for a semiconductor device.

The active layer may be prepared by a solution process of the organic composition for a semiconductor device, for example, screen printing, printing, spin coating, dipping and/or ink jetting. About 0.1 wt % to about 2 wt % of the compound for an organic semiconductor device and about 0.1 wt % to 2 wt % of the metal-containing compound may be added to an organic solvent to form an ICP through linkage of at least two compounds for an organic semiconductor device by a transition element ion or a lanthanide ion. Herein, the organic solvent may be tetrahydrofuran, benzene, chlorobenzene and dichlorobenzene, but is not limited thereto. When an active layer is formed using a solution process, the process cost may be lowered and the resulting transistor may be applicable to manufacture of larger area devices.

Figure 1:
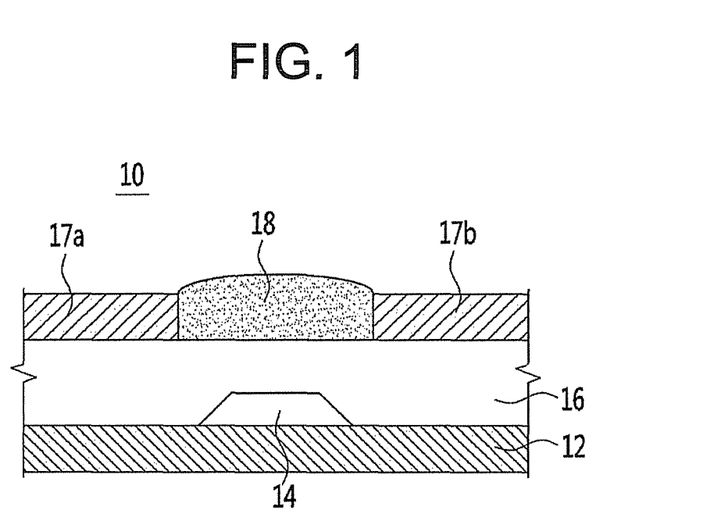
FIGS. 1-2 are schematic cross-sectional views of a transistor according to example embodiments.
Figure 2:
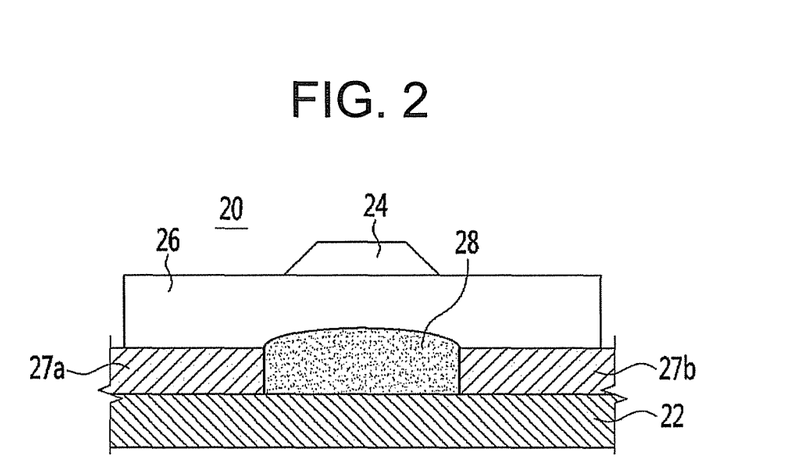

FIGS. 1 and 2 are schematic cross-sectional views showing a transistor according to example embodiments. The transistor according to example embodiments may be a thin film transistor. The thin film transistor may be a thin film having a thickness of about 200 nm to about 1 μm.

Referring to FIG. 1, a transistor 10 may include a substrate 12, a gate electrode 14 disposed on the substrate, and an insulation layer 16 covering the gate electrode 14. On the insulation layer 16, a source electrode 17a and a drain electrode 17b defining a channel region may be provided, and an active layer 18 may be provided in the channel region. The active layer 18 may include the compound for an organic semiconductor device.

Referring to FIG. 2, in a transistor 20, a source electrode 27a and a drain electrode 27b defining a channel region may be formed on a substrate 22, and an active layer 28 may be formed on the channel region. The active layer 28 may include the compound for an organic semiconductor device. An insulation layer 26 may be formed to cover the source electrode 27a, the drain electrode 27b, and the active layer 28, and a gate electrode 24 may be formed thereon.

The substrates 12 and 22 may include an inorganic material, an organic material, or a composite of an inorganic material and an organic material. The organic material may include, for example, a plastic, e.g., polyethylene naphthalate (PEN), polyethylene terephthalate (PET), polycarbonate, polyvinyl alcohol, polyacrylate, polyimide, polynorbornene, and/or polyethersulfone (PES), and the inorganic material may include, for example, glass or metal.

In addition, the gate electrodes 14 and 24, source electrodes 17a and 27a, and drain electrodes 17b and 27b may include a generally-used metal, for example, gold (Au), silver (Ag), aluminum (Al), nickel (Ni), or indium tin oxide (ITO), without limitation.

The insulation layers 16 and 26 may include a generally-used insulator having a high dielectric constant, particularly a ferroelectric insulator, e.g., $Ba_{0.33}Sr_{0.66}TiO_3$ (BST, barium strontium titanate), $Al_2O_3$, $Ta_2O_5$, $La_2O_5$, $Y_2O_3$ and $TiO_2$; an inorganic insulator, e.g., $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3(BZT)$, $BaTiO_3$, $SrTiO_3$, $Bi_4Ti_3O_{12}$, $SiO_2$, $SiN_x$ and AlON; or an organic insulator, e.g., polyimide, benzocyclobutane (BCB), parylene, polyacrylate, polyvinyl alcohol and polyvinylphenol, but is not limited thereto. Although not mentioned above, the inorganic insulator disclosed in U.S. Pat. No. 5,946,551 and the organic insulator disclosed in U.S. Pat. No. 6,232,157, the contents of each of which are hereby incorporated by reference, may be used for the insulation layers 16 and 26.

At least two compounds for an organic semiconductor device may be linked through metal ions produced from ionization of the metal-containing compound, and thereby trap sites that inhibit charge mobility may be removed.

The organic composition for a semiconductor device may be applicable to a solar cell, a memory device, an organic light emitting device (OLED), a photosensor and a laser device.

Hereinafter, this disclosure is illustrated in more detail with reference to examples. However, they are example embodiments of this disclosure and are not limiting.

Example 1

Preparation of Organic Composition for Semiconductor Device 100 mg of the compound of the following Chemical Formula 3 is dissolved in 10 mL of a chlorobenzene (CB) solvent to prepare a first solution. 5 mg of a $Zn(ClO_4)_2$ compound is dissolved in 0.5 mL of methanol (MeOH) to prepare a second solution. The first solution is added to the second solution to prepare an organic composition for a semiconductor device.

[Chemical Formula 3]

In Chemical Formula 3, "n" denotes a number of repeating units. The compound of Chemical Formula 3 has a number average molecular weight (Mn) of 25,000.

Figure 3:
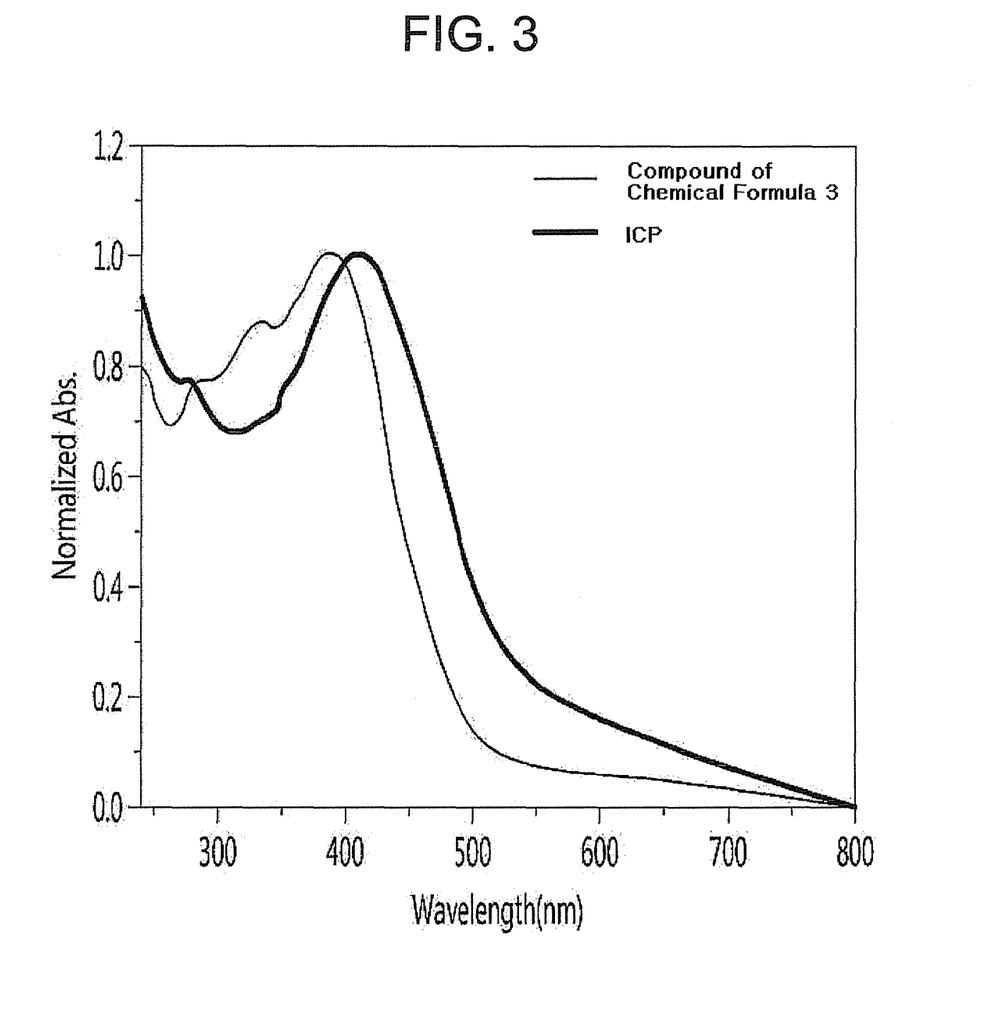
FIG. 3 shows UV-Vis absorption spectra of the compound of Chemical Formula 3 and an ICP.

UV-Vis absorption spectra of the compound of Chemical Formula 3 and an ICP are shown in FIG. 3. As shown in FIG. 3, ICP increases a conjugation length to shift the UV-Vis absorption spectrum wavelength to a longer wavelength.

Example 2

Manufacturing Organic Thin Film Transistor (OTFT)

Firstly, a gate electrode 14 of chromium is deposited at 1000 Å on a cleaned glass substrate 12 by sputtering, and an insulation layer 16 of $SiO_2$ is deposited thereon at 3000 Å by a CVD method. Au is deposited at 700 Å thereon by sputtering to provide a source electrode 17a and a drain electrode 17b. The glass substrate 12 is washed for 10 minutes using isopropyl alcohol, and dried before coating the organic semiconductor material.

In addition, the insulation layer of $SiO_2$ is treated with $UV/O_3$ for 30 minutes before the surface modification. The device is dipped in an octyltrichlorosilane solution that is diluted in n-hexane at a concentration of 10 mM for 30 minutes, washed with hexane and alcohol and dried. The organic composition for a semiconductor device according to Example 1 is coated on the device by spin-coating, and baked at 150° C. for one hour under a nitrogen atmosphere to provide an active layer 18. Thereby, an OTFT device 10 having a structure shown in FIG. 1 is provided.

Comparative Example 1

Manufacturing Organic Thin Film Transistor (OTFT)

An OTFT device 10 having a structure shown in FIG. 1 is manufactured in accordance with the same procedure as in

Example 2, except that the compound of Chemical Formula 3 is used instead of an organic composition for a semiconductor device.

Figure 4:
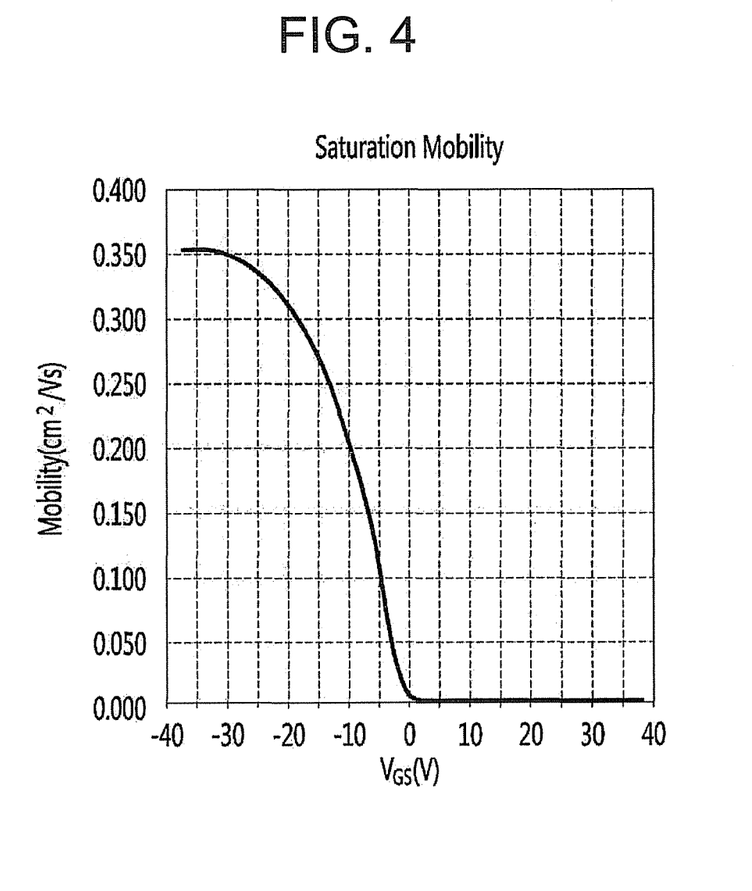
FIGS. 4 and 5 are graphs showing results of current-transfer characteristics of the organic thin film transistor (OTFT) devices according to Example 2 and Comparative Example 1, respectively.
Figure 5:
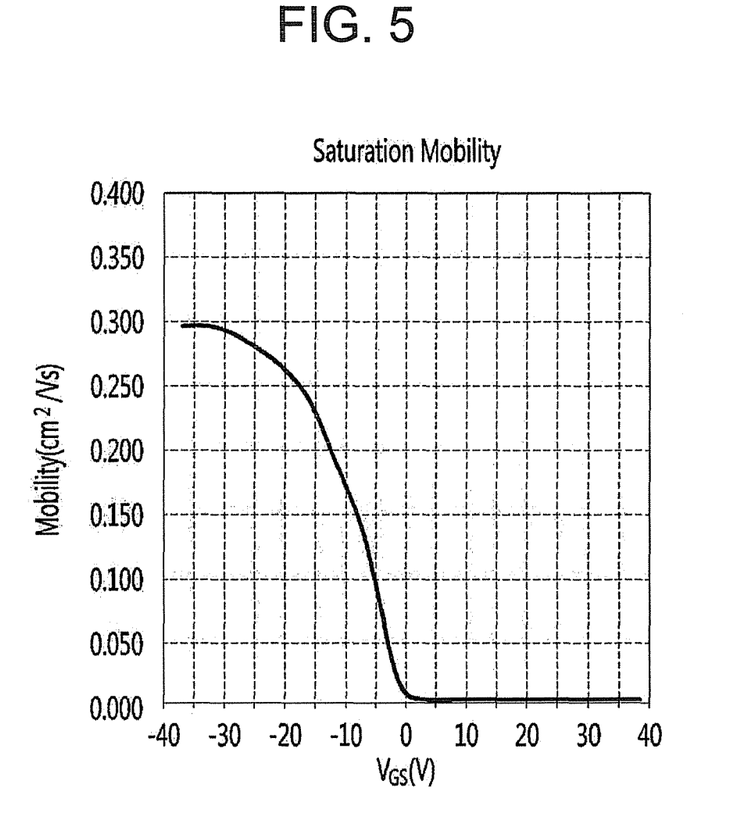

The OTFT devices according to Example 2 and Comparative Example 1 are measured for current-transfer characteristics using a semiconductor characterization system (4200-SCS, KEITHLEY CORP.). The results are shown in FIGS. 4 and 5, respectively. As shown in FIGS. 4 and 5, the device according to Example 2 shows improved charge mobility compared with the device according to Comparative Example 1.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. An organic composition for an organic semiconductor device comprising:
   a compound for an organic semiconductor device including a structural unit represented by the following Chemical Formula 1; and
   a metal-containing compound selected from the group consisting of a salt of a transition element, the transition metal selected from the group consisting of zinc (Zn), silver (Ag), copper (Cu), and platinum (Pt), a salt of a lanthanide, and a combination thereof,
   wherein at least two of the compounds for an organic semiconductor device including the structural unit represented by the following Chemical Formula 1 are linked to each other by a coordination bond with a metal ion of the metal-containing compound to form an ICP:

[Chemical Formula 1]

wherein, in Chemical Formula 1,
Ar is a substituted or unsubstituted $C_6$ to $C_{30}$ aromatic ring group, a substituted or unsubstituted $C_4$ to $C_{30}$ heteroaromatic ring group, or a substituted or unsubstituted $C_6$ to $C_{30}$ condensed polycyclic group,
n is an integer ranging from 1 to 100,
$Y_1$ and $Y_2$ are each independently a single bond, a substituted or unsubstituted $C_6$ to $C_{30}$ arylene group having a conjugation structure, or a substituted or unsubstituted $C_6$ to $C_{30}$ alkenylene group having a conjugation structure, and
$X_1$ and $X_2$ are each independently hydrogen, a halogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, $NR^3R^4$, a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group, provided that at least one of $X_1$ and $X_2$ is a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group,
wherein $R^3$ and $R^4$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, or a combination thereof.

2. The organic composition for an organic semiconductor device of claim 1, wherein the Ar is selected from the group consisting of a thiophene group, a thiazole group, a thiadiazole group, an oxazole group, an isoxazole group, an oxadiazole group, an imidazole group, a pyrazole group, a triazole group, a tetrazole group, a pyridine group, a pyridazine group, a quinoline group, an isoquinoline group, a quinoxaline group, a naphthyridine group, a benzoimidazole group, a pyrimidine group, a pyrimidopyrimidine group, a benzothiadiazole group, a benzoselenadiazole group, a benzotriazole group, a benzothiazole group, a benzooxazole group, a phenanthroline group, a phenazine group, a pyrazine group, a triazine group, a pyridopyrimidine group, a phenaphthyridine group, a naphthalene group, an anthracene group, a tetracene group, an n-phenylene group, and a combination thereof.

3. The organic composition for an organic semiconductor device of claim 1, wherein the $X_1$ and $X_2$ are each independently a substituted or unsubstituted benzoic acid group, a substituted or unsubstituted thiophene carboxylic acid group, a substituted or unsubstituted pyridine group, a substituted or unsubstituted pyrimidine group, or a substituted or unsubstituted triazine group.

4. The organic composition for an organic semiconductor device of claim 1, wherein the compound has a number average molecular weight (Mn) of about 1,000 to about 100,000.

5. The organic composition for an organic semiconductor device of claim 1, wherein the compound represented by the above Chemical Formula 1 is a compound represented by the following Chemical Formulae 2-2, Chemical Formulae 2-3, or Chemical Formulae 2-4:

[Chemical Formula 2-2]

[Chemical Formula 2-3]

[Chemical Formula 2-4]

wherein, in Chemical Formulae 2-2 to 2-4,
$R^1$ to $R^4$ are each independently selected from the group consisting of a fluoro group, a $C_1$ to $C_{30}$ linear or branched alkyl group, a $C_3$ to $C_{30}$ cycloalkyl group, a $C_1$ to $C_{20}$ fluoroalkyl group, a $C_1$ to $C_{20}$ perfluoroalkyl group ($C_nF_{2n+1}$), a $C_1$ to $C_{30}$ linear or branched alkoxy group, a $C_3$ to $C_{30}$ cycloalkoxy group, a $C_2$ to $C_{30}$ linear or branched alkoxyalkyl group, a $C_4$ to $C_{30}$ cycloalkoxyalkyl group, and a combination thereof, and m is an integer ranging from 1 to 100.

6. The organic composition for an organic semiconductor device of claim 1, wherein the salt includes at least one of a sulfate, a chlorate, a nitrate, and a combination thereof.

7. A transistor comprising:
a source electrode and a drain electrode facing each other and defining a channel region; and
an active layer in the channel region, wherein the active layer includes an organic composition for an organic semiconductor device, the organic composition including,
a compound for an organic semiconductor device including a structural unit represented by the following Chemical Formula 1; and
a metal-containing compound selected from the group consisting of a salt of a transition element, the transition metal selected from the group consisting of zinc (Zn), silver (Ag), copper (Cu), and platinum (Pt), a salt of a lanthanide, and a combination thereof,
wherein at least two of the compounds for an organic semiconductor device including the structural unit represented by the following Chemical Formula 1 are linked to each other by a coordination bond with a metal ion of the metal-containing compound to form an ICP:

[Chemical Formula 1]

wherein, in Chemical Formula 1,
Ar is a substituted or unsubstituted $C_6$ to $C_{30}$ aromatic ring group, a substituted or unsubstituted $C_4$ to $C_{30}$ heteroaromatic ring group, or a substituted or unsubstituted $C_6$ to $C_{30}$ condensed polycyclic group,
n is an integer ranging from 1 to 100,
$Y_1$ and $Y_2$ are each independently a single bond, a substituted or unsubstituted $C_6$ to $C_{30}$ arylene group having a conjugation structure, or a substituted or unsubstituted $C_6$ to $C_{30}$ alkenylene group having a conjugation structure, and
$X_1$ and $X_2$ are each independently hydrogen, a halogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, $NR^3R^4$, a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group, provided that at least one of $X_1$ and $X_2$ is a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group,
wherein $R^3$ and $R^4$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, or a combination thereof.

8. The transistor of claim 7, wherein the transistor further comprises an insulation layer configured to electrically insulate the source electrode and drain electrode, and the gate electrode.

9. An electronic device comprising an organic composition for an organic semiconductor device, the organic composition including,
a compound for an organic semiconductor device including a structural unit represented by the following Chemical Formula 1; and
a metal-containing compound selected from the group consisting of a salt of a transition element, the transition metal selected from the group consisting of zinc (Zn), silver (Ag), copper (Cu), and platinum (Pt), a salt of a lanthanide, and a combination thereof,
wherein at least two of the compounds for an organic semiconductor device including the structural unit represented by the following Chemical Formula 1 are linked to each other by a coordination bond with a metal ion of the metal-containing compound to form an ICP:

[Chemical Formula 1]

wherein, in Chemical Formula 1,
Ar is a substituted or unsubstituted $C_6$ to $C_{30}$ aromatic ring group, a substituted or unsubstituted $C_4$ to $C_{30}$ heteroaromatic ring group, or a substituted or unsubstituted $C_6$ to $C_{30}$ condensed polycyclic group,
n is an integer ranging from 1 to 100,
$Y_1$ and $Y_2$ are each independently a single bond, a substituted or unsubstituted $C_6$ to $C_{30}$ arylene group having a conjugation structure, or a substituted or unsubstituted $C_6$ to $C_{30}$ alkenylene group having a conjugation structure, and
$X_1$ and $X_2$ are each independently hydrogen, a halogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, $NR^3R^4$, a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group, provided that at least one of $X_1$ and $X_2$ is a carboxyl group (—COOH), a $C_6$ to $C_{30}$ aryl group substituted with a carboxyl group, a $C_3$ to $C_{20}$ cycloalkyl group substituted with a carboxyl group, a $C_2$ to $C_{30}$ heteroaryl group substituted with a carboxyl group, or a $C_2$ to $C_{30}$ N-containing aromatic ring group,
wherein $R^3$ and $R^4$ are each independently hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, or a combination thereof.

* * * * *